United States Patent
Susami

(10) Patent No.: US 6,452,208 B1
(45) Date of Patent: *Sep. 17, 2002

(54) SEMICONDUCTOR CHIP INCLUDING A REFERENCE ELEMENT HAVING REFERENCE COORDINATES

(75) Inventor: Takayuki Susami, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/547,778

(22) Filed: Apr. 12, 2000

(30) Foreign Application Priority Data

Apr. 13, 1999 (JP) .......................... 11-105590

(51) Int. Cl.$^7$ .............................. H01L 23/58
(52) U.S. Cl. .................. 257/48; 257/536; 257/538; 257/84; 438/14; 438/11
(58) Field of Search ................ 257/536, 538, 257/84, 79, 797, 48, 734, 522; 438/17–18, 11, 14, 15; 365/201; 324/555; 356/375

(56) References Cited

U.S. PATENT DOCUMENTS

| 3,808,527 A | * | 4/1974 | Thomas ...................... 324/65 |
| 5,619,462 A | * | 4/1997 | McClure ..................... 365/201 |
| 5,753,391 A | * | 5/1998 | Stone ......................... 430/22 |
| 5,898,228 A | * | 4/1999 | Sugasawara ................ 257/797 |
| 5,999,465 A | * | 12/1999 | Shabde ....................... 365/200 |
| 6,108,472 A | * | 8/2000 | Rickman ..................... 385/48 |
| 6,124,143 A | * | 9/2000 | Sugasawada ................ 438/18 |

FOREIGN PATENT DOCUMENTS

JP        8-247790        9/1996

* cited by examiner

Primary Examiner—Olik Chaudhuri
Assistant Examiner—Nathan W. Ha
(74) Attorney, Agent, or Firm—Foley & Lardner

(57) ABSTRACT

A semiconductor chip has, at a corner area of the chip, an evaluation test circuit for evaluating the operational speed of the internal circuit of the semiconductor chip, and a reference element having a known coordinates and emitting light and/or generating heat upon energization thereof. Coordinates of a failed element found in a normal test are fixed with respect to the known coordinates of the reference element for analyzing the failed element.

14 Claims, 6 Drawing Sheets

SEMICONDUCTOR CHIP INCLUDING A REFERENCE ELEMENT HAVING REFERENCE COORDINATES

BACKGROUND OF THE INVENTION

(a) Field of the Invention

The present invention relates to a semiconductor chip including a reference element having reference coordinates and, more particularly, to a semiconductor chip including a reference element used for fixing the coordinates of a failed element in a LSI.

(b) Description of a Related Art

It is desired to accurately fix the location of a particular element or member in a LSI or other devices. In an industry where an accurate fixing of the location is especially desired, there is a technique by which a micron-order location fixing is possible.

JP-A-8(1996)-247790 describes a location fixing technique in a LSI wherein a large number of photodetectors are arranged in an array for fixing the location by detecting and analyzing optical signals. The proposed technique allows accurate location fixing; however, involves disadvantages of higher costs and a larger circuit scale due to the large number of photodetectors (or transistors) integrated therein.

Incorporation of a location fixing function by using a large number of transistors into a semiconductor chip degrades the integration density of the semiconductor device due to the redundant semiconductor elements, which are not used directly for the inherent function of the semiconductor chip itself.

In general, the location fixing function in a semiconductor chip is used after a malfunction of a device element is found therein. In this case, the malfunction of the device element is generally accompanied by light emission or heat generation therefrom, and thus the location of the malfunction is fixed by detecting the location for the light emission or heat generation.

Infrared ray is used for the identification of the failed element, or the location of the light emission or heat generation, wherein the infrared ray is irradiated onto the bottom surface of the semiconductor chip, as shown in FIG. 1. The image of the pattern including the failed element is then recognized at the bottom surface in the reflected infrared ray, whereby the failed element is identified in the infrared ray by reference to the design pattern.

The infrared ray technique as used above often fails in an accurate location fixing due to an obscure image of the pattern caused by poor resolution. In addition, the infrared ray technique itself cannot be employed depending on the fabrication process used therefor because pattern recognition for identification of the failed element is sometimes impossible. Thus, the infrared ray technique is not always effective in fact for identification of the failed elements.

In an alternative, the light emission or heat generation accompanied by the malfunction of the device element can be recognized by inspection of the bottom surface of the semiconductor chip, as also shown in FIG. 1. However, since the light emission or heat generation of the failed element is recognized in fact by observing the light passing from the top surface through the bottom surface, there is a possibility that the image of the failed element in the pattern of the light deviates from the real pattern due to refraction of light.

SUMMARY OF THE INVENTION

In view of the above, it is an object of the present invention to provide a semiconductor chip having a location fixing function for a failed element substantially without degrading the integration density and without impairing the function of the internal circuit in the semiconductor chip.

It is another object of the present invention to provide a method for fixing the location of a failed element in a semiconductor chip.

The present invention provides a semiconductor device including a plurality of device elements and a reference element located at a reference position of the semiconductor chip for fixing the location of one of the device elements with respect to the reference element, the reference element emitting light and/or generating heat upon energization thereof.

In accordance with the semiconductor device of the present invention, a failed one of the device elements emitting light and/or generating heat due to the malfunction thereof can be fixed for the location thereof by reference to the reference element while the reference element is energized for light emission and/or heat generation. The failed element and the reference element can be recognized in the semiconductor device due to the light emission and/or heat generation by the failure of the failed element and by the energization of the reference element.

By fixing the reference location of the failed element with respect to the reference element, both of which emit light and/or generate heat, the location of the malfunction can be easily determined by reference to a design pattern. It is preferable that the number of reference elements be two or more, whereby the failed element is fixed for the location thereof with respect to the reference elements in the semiconductor chip.

The reference element in the present invention is not limited in its structure or material so long as the reference element emits light and/or generates heat upon energization thereof. For example, the reference element may be implemented by a polysilicon layer connected at both ends thereof to external terminals through interconnects, or may be implemented by a transistor or a resistor element.

For improvement of the accuracy for fixing the location of the malfunction, the reference element should emit light and/or generate heat at a small area, or substantially at a point specified by a pair of two-dimensional coordinates. If the reference element is implemented by a polysilicon layer, the area for the polysilicon layer is preferably below 1 $\mu$m×1 $\mu$m, and may be around or below 0.4 $\mu$m×0.4 $\mu$m.

The above and other objects, features and advantages of the present invention will be more apparent from the following description, referring to the accompanying drawings.

PREFERRED EMBODIMENTS OF THE INVENTION

Figure 1:
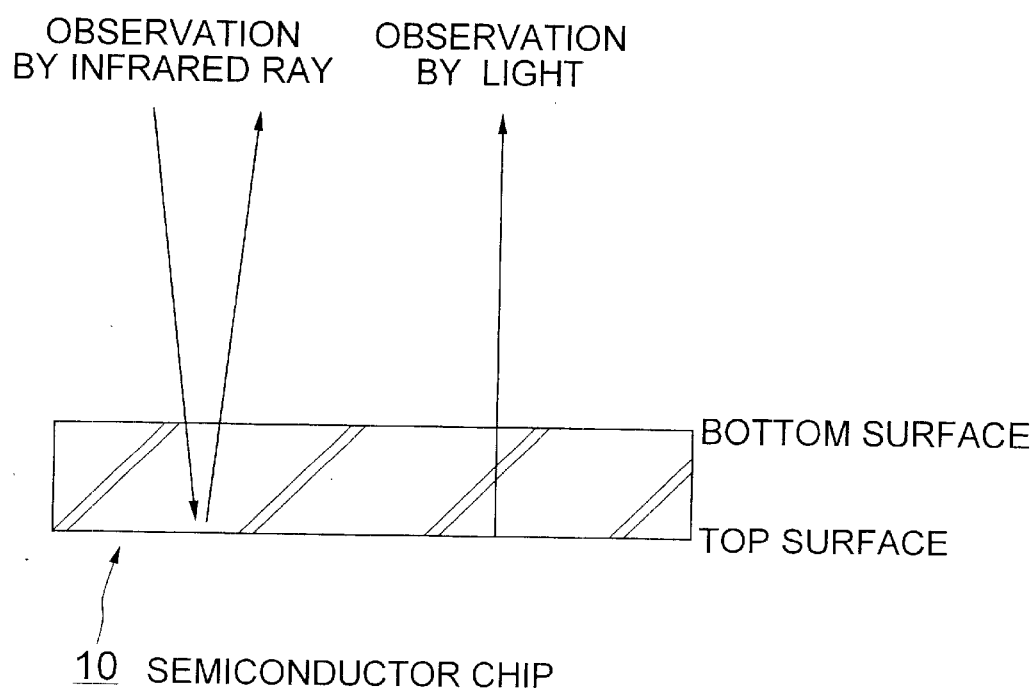
FIG. 1 is a sectional view of a semiconductor chip for showing observation of failed element either by using reflected infrared ray or passing light.

Now, the present invention is more specifically described with reference to accompanying drawings, wherein similar constituent elements are designated by similar reference numerals.

Figure 2:
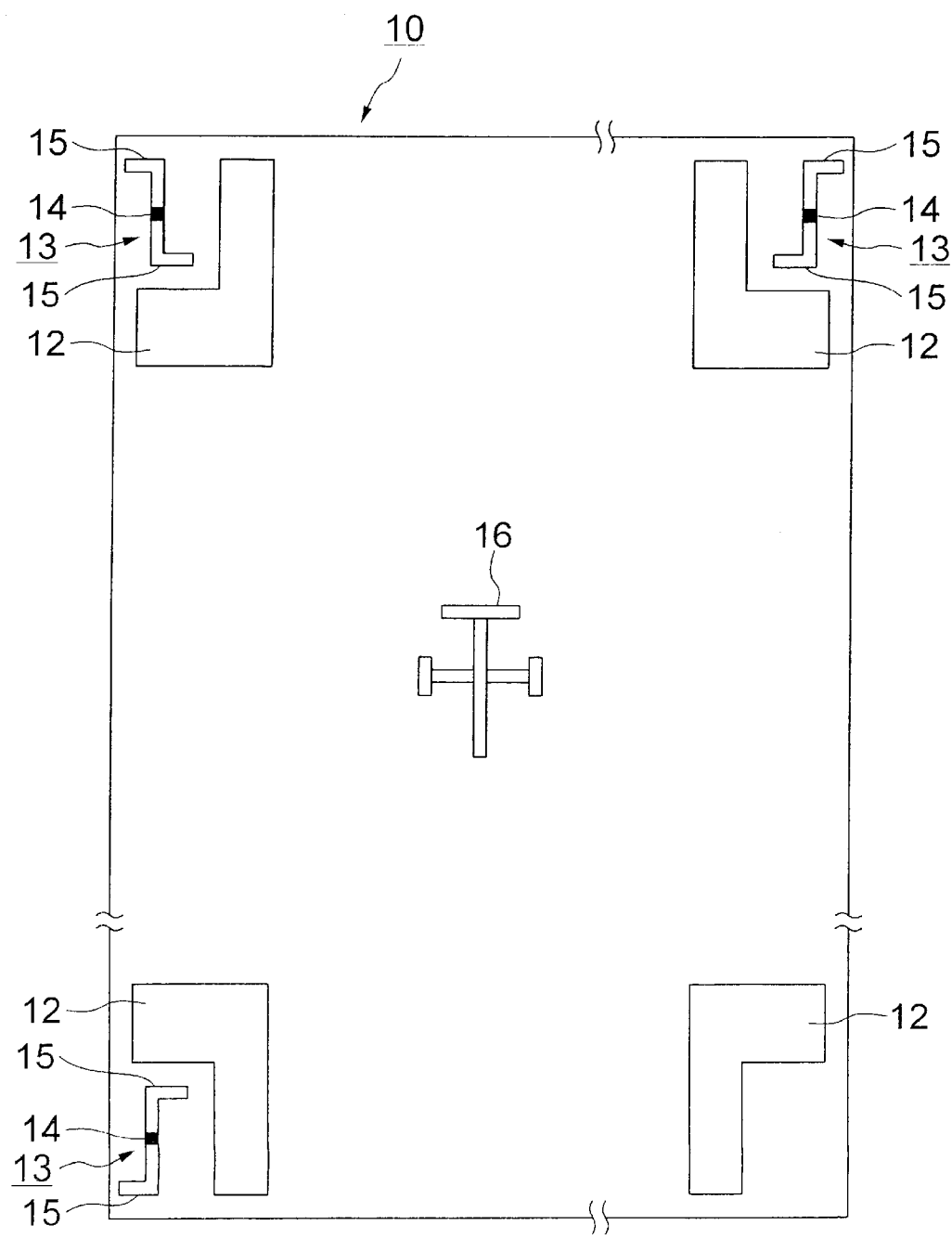
FIG. 2 is a top plan view of a semiconductor chip according to a first embodiment of the present invention.

Referring to FIG. 2, a semiconductor chip, generally designated by numeral 10, according to a first embodiment of the present invention includes an evaluation test circuit 12 at each corner region of the chip 10, the evaluation test circuit 12 having a shape of letter "L". The inner corner of the letter "L" is directed to a corresponding corner of the semiconductor chip 10. A reference element 13 is disposed in the vicinity of each of three of the corners between one of the evaluation test circuit 12 and a corresponding corner. The reference element 13 includes a polysilicon resistor 14, for light emission and heat generation, having a small square area connected to a pair of aluminum (Al) electrodes 15 at both ends of the polysilicon resistor 14. The area for the polysilicon resistor 14 is 0.4 $\mu$m×0.4 $\mu$m, for example.

The polysilicon resistor 14 passes current to emit light and generate heat upon energization thereof through the Al electrodes 15 by using an external signal so that the reference element 13 does not cause any disturbance to the normal operation of the semiconductor chip 10.

The current passing through the polysilicon resistor 14 causes light emission and heat generation at the small area as small as 0.4 $\mu$m×0.4 $\mu$m, without causing light emission or heat generation by the Al electrodes 15. The location of the reference element 13 at the space for the L-shaped evaluation test circuit 12 does not affect the normal operation of the evaluation test circuit 12 as well as the other circuit portion of the semiconductor chip 10.

The area of the semiconductor chip 10 other than the vicinities of the four corners is occupied by an internal circuit of the semiconductor chip 10 including a large number of functional elements and circuits, such as a failed transistor 16 depicted therein. The failed transistor 16 may emit light and/or generate heat due to the malfunction.

When the semiconductor chip 10 is observed at the bottom surface thereof after energizing the reference elements 13, infrared ray or longer-wavelength ray can be observed which defines the images for the reference elements 13 each having known two-dimensional coordinates as well as the failed element 16 having unknown coordinates. The coordinates of the failed element 16 can be determined with respect to the coordinates of the reference elements 13. Thus, the location for the failed element 16 can be fixed.

In the above configuration, the external signal for energizing the reference elements 13 is not supplied during a normal test mode for the semiconductor chip 10. The external signal is supplied after a malfunction is detected in the normal test mode. Thus, the reference elements 13 do not affect the operation of the semiconductor chip during the normal test mode, whereas the reference elements 13 can be used as reference coordinates for determining the location of the malfunction.

It is usual to dispose an evaluation test circuit in a semiconductor chip for evaluating the operational speed (or characteristics) of the internal circuit. The evaluation test circuit is generally supplied with an external signal from an external test terminal for evaluation of the operational speed, as in the case of the evaluation test circuits 12 in the semiconductor chip 10 of FIG. 2

Figure 3:
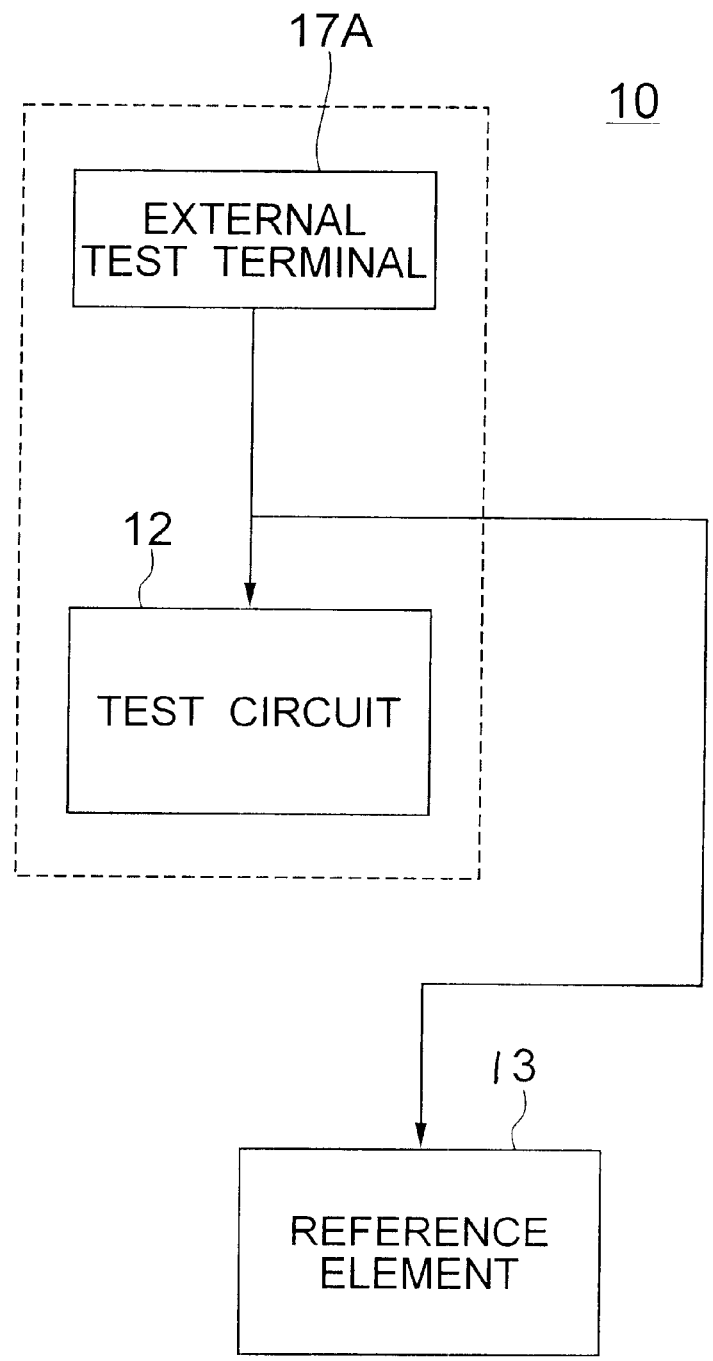
FIG. 3 is a schematic view of a modification of the semiconductor chip of FIG. 2.

Referring to FIG. 3 showing a modification of the embodiment of FIG. 2, the reference element 13 is connected to an external test terminal 17A for supplying a test signal to the evaluation test circuit 12 for evaluation of the operational speed of the semiconductor chip 10. In this configuration, the reference element 13 is energized by an input current supplied from the external test terminal 17A each time the evaluation test circuit 12 is subjected to a test operation for evaluation of the operational speed of the semiconductor chip 10. Since the other circuit portion is electrically separated from the reference element 13 and the evaluation test circuit 12, the reference element 13 can be energized without affecting the function of the other circuit portion, or the internal circuit, in the semiconductor chip 10. Thus, the reference element 13 can be used as reference coordinates to analyze the failed element, if any.

Figure 4:
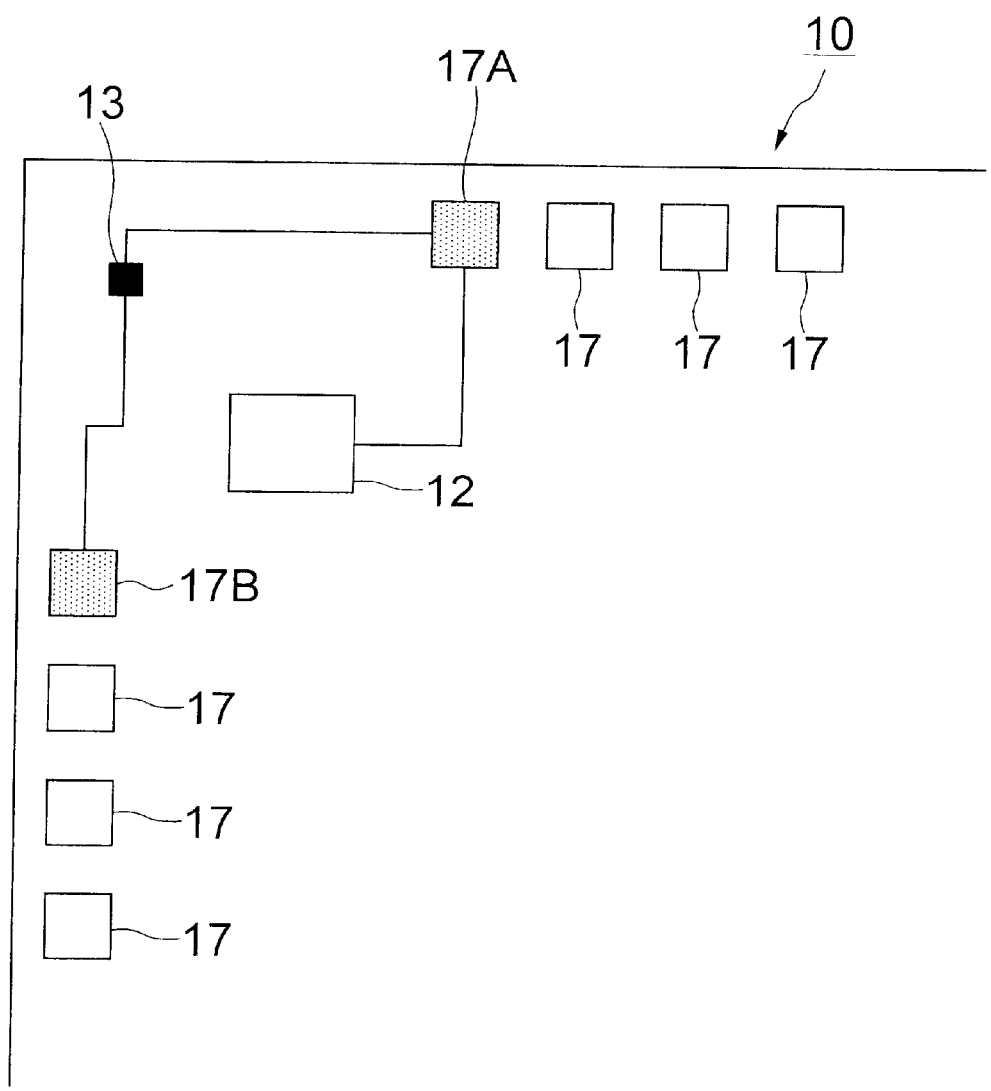
FIG. 4 is an exemplified partial top plan view of the semiconductor chip of FIG. 3.

Referring to FIG. 4 showing an exemplified top plan view for the configuration shown in FIG. 3, the reference element 13 disposed in the vicinity of a corner of the chip 10 is connected to the external test terminal 17A which is a nearest one of the input terminals 17 arranged in a row extending parallel to one side of the semiconductor chip 10, and also connected to an external ground terminal 17B which is a nearest one of the input terminals 17 arranged in a row extending parallel to another side of the semiconductor chip 10 perpendicular to the one side. The external test terminal 17A is also connected to the evaluation test circuit 12 disposed in the vicinity of the corner, with the reference element 13 being disposed therebetween.

During fabrication of the evaluation test circuit 12 in the semiconductor chip 10, the reference element 13 is disposed in a space in the vicinity of the test circuit 12 at a corner area or a peripheral area of the chip. The reference element 13 is connected to the external ground terminal 17B at one end thereof, and then connected to the external test terminal 17A at the other end thereof. Thus, the reference element 13 can be integrated in the chip 10 without affecting the function of the internal circuit.

The number of reference elements 13 disposed in a chip is preferably two, and more preferably three for effectively fixing the coordinates of a failed element. Three reference elements allow accurate coordinates to be fixed along X-axis and Y-axis, especially when the semiconductor chip is subjected to turn-over or revolution. The location of the reference element 13 is not limited to the vicinity of the corner or periphery of the chip 10 and may be in the central area of the chip 10.

The disposition of the reference element 13 at the corner area allows feasible incorporation of the reference element 13 into a semiconductor chip 10 of a new design as well as a semiconductor chip of the current design. In the latter case, the reference element 13 can be incorporated into the chip by minor modification of the current design substantially without changing the principal part of the chip.

Figure 5:
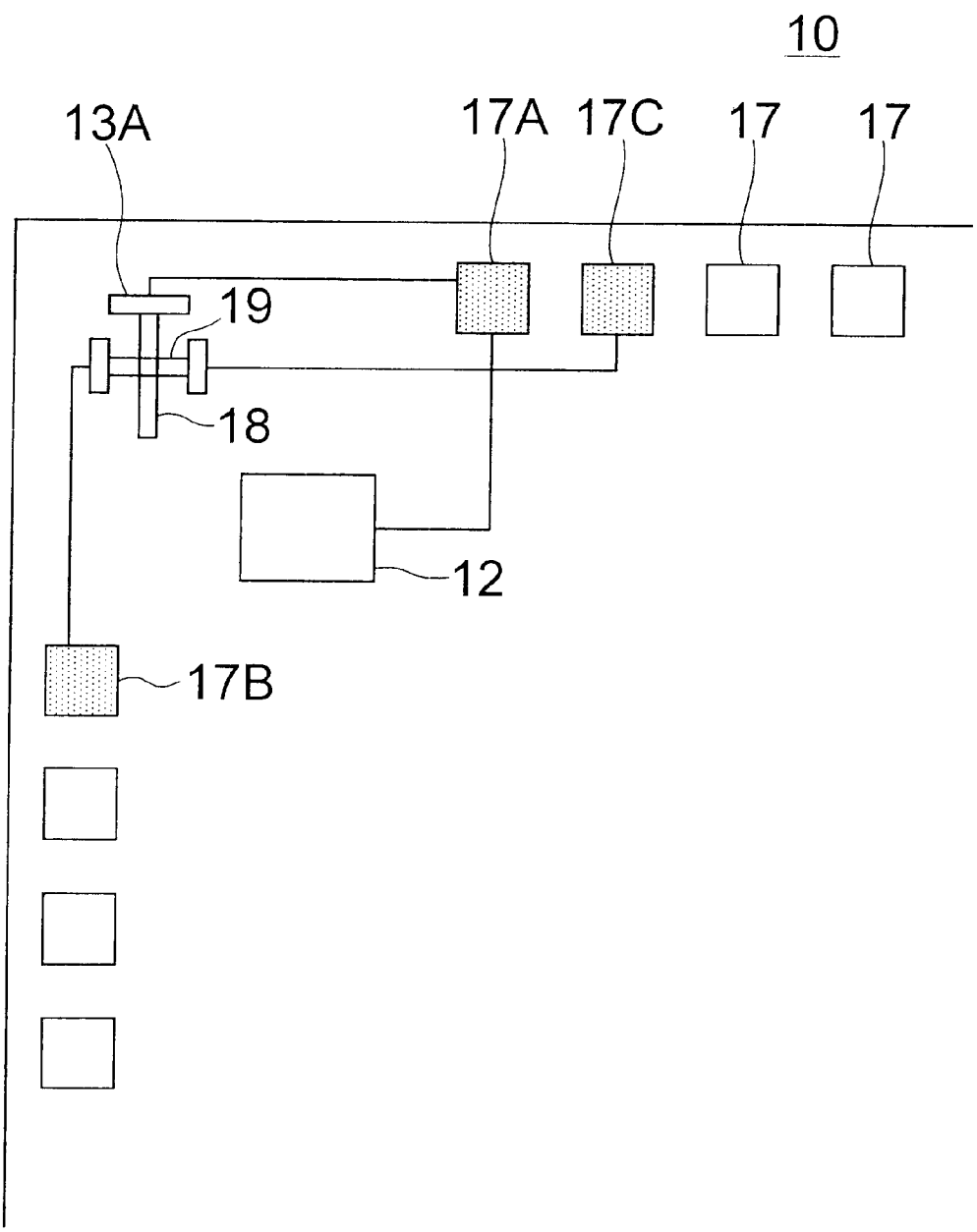
FIG. 5 is a partial top plan view of a semiconductor chip according to a second embodiment of the present invention.

Referring to FIG. 5, a semiconductor chip according to a second embodiment of the present invention is similar to the semiconductor chip of FIG. 4 except for the configuration of the reference element. More specifically, the reference element 13A in the present embodiment is implemented by a FET, which includes a ate 18 connected to an external test terminal 17A, and a diffused region 19 connected between an external source terminal 17C and an external ground terminal 17B. The external test terminal 17A is also connected to the evaluation test circuit 12. The gate of the reference FET 13A has a small length "L" and a small width "W" for a small area for light emission and/or heat generation, wherein both L and W are preferably below 1 $\mu$m, and more concretely, may be equal to 0.4 $\mu$m, for example.

The reference FET 13A emits light and/or generates heat upon energization by supplying a test signal to the external test terminal 17A, as in the case of the first embodiment. The reference FET 13A may be either of a p-channel or of an n-channel; however, an n-channel FET is more preferable because the n-channel FET has a higher light emission efficiency compared to the p-channel FET.

Figure 6:
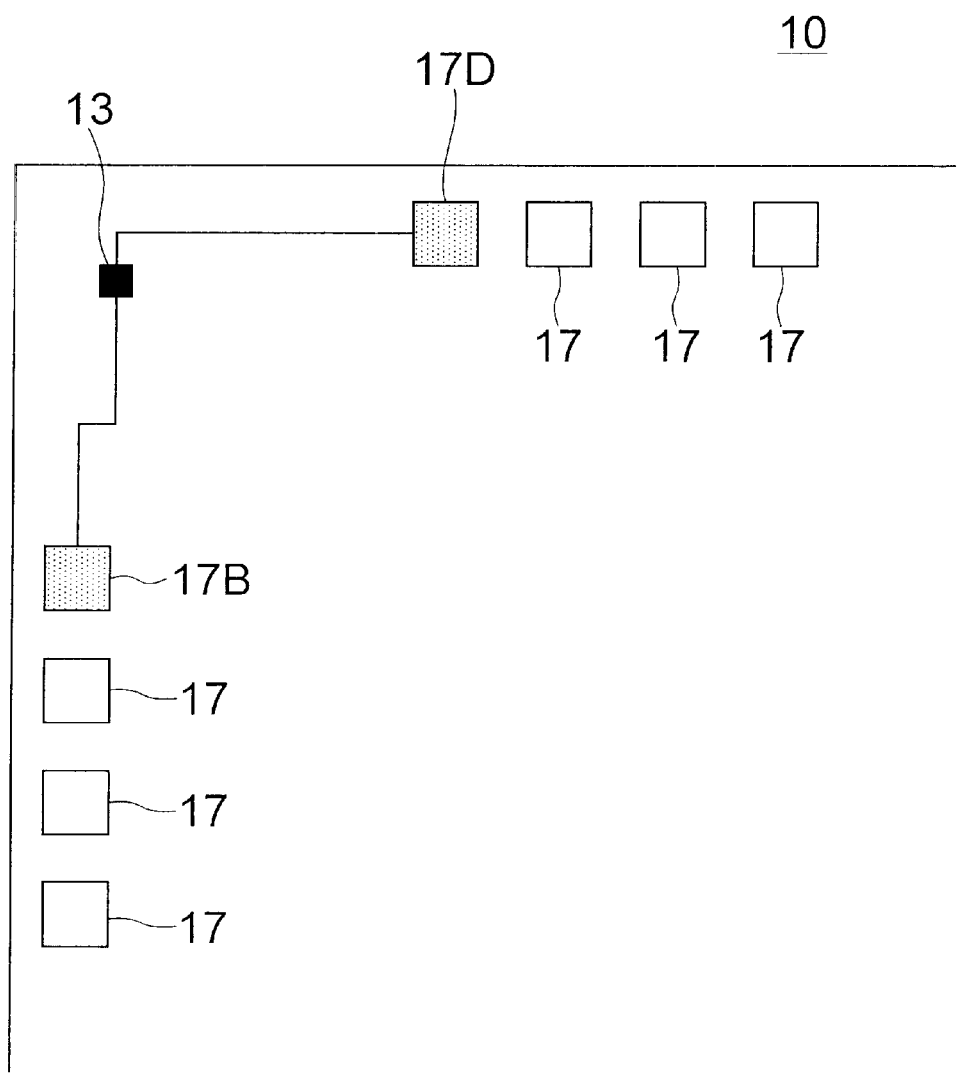
FIG. 6 is a partial top plan view of a semiconductor chip according to a third embodiment of the present invention.

Referring to FIG. 6, a semiconductor chip 10 according to a third embodiment of the present invention includes a reference element 13 connected between an internal pad 17D which is not connected to an external pin and an external ground terminal 17B. During a test operation of the semiconductor chip 10, the pad 17D is contacted by a probe pin while the other external terminals 17 and 17B are contacted by other probe pins. In this configuration, although the number of probe pins in a test instrument increases by one compared to the ordinary test instrument, the reference element 13 can be electrically separated from other circuit portion.

Since the above embodiments are described only for examples, the present invention is not limited to the above embodiments and various modifications or alterations can be easily made therefrom by those skilled in the art without departing from the scope of the present invention.

What is claimed is:

1. A semiconductor chip comprising a plurality of device elements, and a reference element located at a reference position of the semiconductor chip for fixing coordinates of one of said device elements with respect to coordinates of said reference element, said reference element having a pair of electrodes and a region for emitting light and/or heat disposed there between and emitting light and/or generating heat upon energization thereof, said light and/or heat generated in said region of the reference element when a signal external to said chip is applied to said electrodes.

2. The semiconductor chip as defined in claim 1, wherein said reference element is connected to an external terminal.

3. The semiconductor chip as defined in claim 2, wherein said external terminal is a test terminal of an evaluation test circuit for evaluation of characteristics of the semiconductor chip.

4. The semiconductor chip as defined in claim 1, wherein said reference element is connected to an internal pad not connected to an external terminal.

5. The semiconductor chip as defined in claim 1, wherein said reference element emits lights and/or generates heat substantially at a position specified by a single set of two-dimensional coordinates.

6. The semiconductor chip as defined in claim 1, wherein said reference element is disposed in a vicinity of each of two of four corners of the semiconductor chip.

7. The semiconductor chip as defined in claim 1, wherein said reference element is disposed in a vicinity of each of three of four corners of the semiconductor chip.

8. A method of identifying location of malfunction in a semiconductor device having a plurality of device elements, comprising the steps of:
    providing a reference element on the semiconductor device at a known reference position;
    detecting a failed element of the device elements;
    energizing the reference element to generate a light emission and/or heat generation at the known reference position; and
    fixing coordinates of the failed element with respect to coordinates of the reference element by detecting the generated light emission and/or heat generation at the known reference position.

9. A semiconductor chip comprising:
    a plurality of device elements; and
    at least one reference element positioned at a known reference position on the semiconductor chip,
    wherein the reference element emits light or generates heat upon energization thereof so that coordinates of any of the device elements that fails are detected with reference to the position of reference element as determined by the emitted light or generated heat from the reference element at the known reference position on the semiconductor chip.

10. The semiconductor chip according to claim 9, further including external terminals, the reference element being connected to the external terminals.

11. The semiconductor chip according to claim 10, further including an evaluation test circuit for evaluating characteristics of the semiconductor chip, wherein the external terminals are test terminals of the evaluation test circuit.

12. The semiconductor chip according to claim 9, further including internal pads, the external terminals being connected to the internal pads.

13. The semiconductor chip according to claim 9, wherein the semiconductor chip has four corners and the number of reference element is two, each disposed near one of the four corners.

14. The semiconductor chip according to claim 9, wherein the semiconductor chip has four corners and the number of reference element is three, each disposed near one of the four corners.

* * * * *